United States Patent
Amagai

(10) Patent No.: US 7,508,844 B2
(45) Date of Patent: Mar. 24, 2009

(54) FRAME SIGNAL WAVEFORM OBSERVATION APPARATUS AND METHOD

(75) Inventor: Mitsuo Amagai, Isehara (JP)

(73) Assignee: Anritsu Corporation, Atsugi-shi (JP)

( * ) Notice: Subject to any disclaimer, the term of this patent is extended or adjusted under 35 U.S.C. 154(b) by 656 days.

(21) Appl. No.: 10/524,066

(22) PCT Filed: Jul. 7, 2004

(86) PCT No.: PCT/JP2004/009988

§ 371 (c)(1),
(2), (4) Date: Feb. 8, 2005

(87) PCT Pub. No.: WO2005/005997

PCT Pub. Date: Jan. 20, 2005

(65) Prior Publication Data

US 2005/0271087 A1 Dec. 8, 2005

(30) Foreign Application Priority Data

Jul. 14, 2003 (JP) ............................. 2003-196811

(51) Int. Cl.
*H04J 3/06* (2006.01)
*H04J 3/02* (2006.01)
(52) U.S. Cl. ...................................... 370/512; 370/539
(58) Field of Classification Search ................ 370/509, 370/510, 512, 513, 514; 375/354
See application file for complete search history.

(56) References Cited

U.S. PATENT DOCUMENTS

| | | | |
|---|---|---|---|
| 5,245,630 A | 9/1993 | Ainsworth | |
| 6,219,094 B1 | 4/2001 | Gerlach et al. | |
| 6,546,345 B1 * | 4/2003 | Ghiasi | 702/67 |
| 7,035,292 B1 * | 4/2006 | Giorgetta et al. | 370/509 |
| 2004/0143406 A1 | 7/2004 | Nishikobara et al. | |

FOREIGN PATENT DOCUMENTS

| | | |
|---|---|---|
| JP | 5-145582 A | 6/1993 |
| JP | 2000-354254 A | 12/2000 |

\* cited by examiner

*Primary Examiner*—Kwang B. Yao
*Assistant Examiner*—Juvena Loo
(74) *Attorney, Agent, or Firm*—Frishauf, Holtz, Goodman & Chick, P.C.

(57) ABSTRACT

A trigger signal generating apparatus includes a frame synchronous circuit which receives a frame signal having a predetermined bit rate and outputs a synchronous signal in synchronism with an input timing of leading data of the frame signal, a position information output circuit which receives the synchronous signal output by the frame synchronous circuit and outputs the position information indicating an input bit position of the frame signal, a position designator which designates an arbitrary bit position of the frame signal, and a trigger signal generating circuit which outputs a trigger signal at a timing when the position information output by the position information output circuit is coincident with the arbitrary bit position designated by the position designator. A trigger is generated accurately at an arbitrary bit position of the frame position.

12 Claims, 3 Drawing Sheets

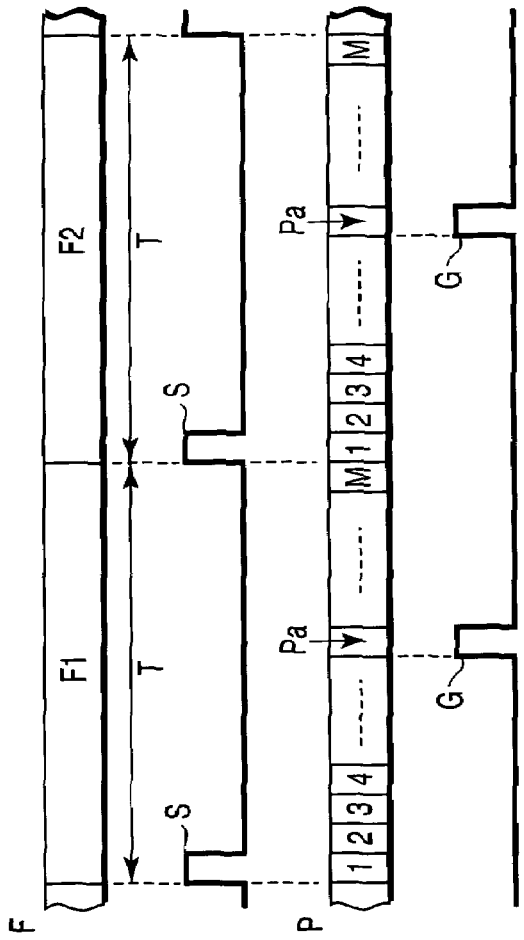

FRAME SIGNAL WAVEFORM OBSERVATION APPARATUS AND METHOD

This application is a U.S. National Phase Application under 35 USC 371 of International Application PCT/JP2004/009988 filed Jul. 7, 2004.

TECHNICAL FIELD

The present invention relates to a trigger signal generating system and a frame signal waveform observation system using the trigger signal generating system, or in particular to a trigger signal generating system including a trigger signal generating apparatus and method and a frame signal waveform observation system including a frame signal waveform observation apparatus and method using the trigger signal generating system which employ a technique capable of accurate triggering at an arbitrary bit position of the frame signal in order to accurately acquire and observe the waveform at an arbitrary bit position.

BACKGROUND ART

In a digital synchronous network for transmitting a data signal multiplexed as a frame signal such as a digital synchronous transmission system including a synchronous digital hierarchy (SDH), synchronous optical network (SONET) or optical transport network (OTN), a large phase fluctuation (jitter or wander), if any, of the data signal would make it impossible to transmit the data signal correctly.

In constructing a digital synchronous data transmission system, therefore, it is necessary to accurately measure the resistance to the phase fluctuation and the transmission characteristic of the various transmission devices of the system in advance.

This measurement requires accurate determination of the phase variation of the data signal applied to the transmission devices to be measured and the phase variation of the data signal output from the transmission devices.

As a conventional technique for grasping the phase variation of the data signals, a method is known wherein the data signal is input to the oscilloscope and the width W of the level transition portion of the eye pattern displayed as shown in FIG. 7 is observed (Patent Document 1: Jpn. Pat. Appln. KOKAI Publication No. 5-145582).

The phase variation is of either random noise type or dependent on the pattern of the data signal. In the observation of the eye pattern described above, the user can grasp only the maximum value of the phase variation as a combination of both types, and cannot determine the phase lead or lag of each bit position of the frame signal such as the actual data signal composed of predetermined bits.

DISCLOSURE OF INVENTION

The object of this invention is to provide a trigger signal generating system and a frame signal waveform observation system using the trigger signal generating system, or in particular to a trigger signal generating system including a trigger signal generating apparatus and method and a frame signal waveform observation system including a frame signal waveform observation apparatus and method using the trigger signal generating system which employ a technique capable of accurate triggering at an arbitrary bit position of the frame signal in order to accurately acquire and observe the waveform at an arbitrary bit position.

According to a first aspect of the invention, there is provided a trigger signal generating apparatus (20) comprising:

a frame synchronous circuit (21) which receives a frame signal having a predetermined bit rate and outputs a synchronous signal in synchronism with an input timing of leading data of the frame signal;

a position information output circuit (22) which receives the synchronous signal output by the frame synchronous circuit and outputs position information indicating an input bit position of the frame signal;

a position designator (23) which designates an arbitrary bit position of the frame signal; and a trigger signal generating circuit (24) which outputs a trigger signal at a timing when the position information output by the position information output circuit is coincident with the arbitrary bit position designated by the position designator.

According to a second aspect of the invention, there is provided a trigger signal generating apparatus of the first aspect, wherein the frame signal having the predetermined bit rate is a frame signal transmitted through a digital synchronous network.

According to a third aspect of the invention, there is provided a trigger signal generating apparatus of the second aspect, wherein the frame signal transmitted by the digital synchronous network is that of one of the digital synchronous transmission systems including a synchronous digital hierarchy (SDH), synchronous optical network (SONET) and optical transport network (OTN).

According to a fourth of the invention, there is provided a trigger signal generating apparatus of the third aspect, wherein when the frame signal transmitted by the digital synchronous network is associated with one of the digital synchronous transmission systems including SDH, SONET and OTN, the arbitrary bit position designated by the position designator is a specified part of an overhead of the frame signal of the digital synchronous transmission system.

According to a fifth aspect of the invention, there is provided a trigger signal generating apparatus of the fourth aspect, wherein the specified part of the overhead of the frame signal of the digital synchronous transmission system is not scrambled.

According to a sixth aspect of the invention, there is provided a trigger signal generating apparatus of the first aspect, further comprising:

a clock recovery circuit (30) which receives the frame signal having the predetermined bit rate and recovers and outputs a clock from the frame signal.

According to a seventh aspect of the invention, there is provided a frame signal waveform observation apparatus (40) comprising:

a trigger signal generating apparatus (20) comprising;

a frame synchronous circuit (21) which receives a frame signal having a predetermined bit rate and outputs a synchronous signal in synchronism with an input timing of leading data of the frame signal, a position information output circuit (22) which receives the synchronous signal output by the frame synchronous circuit and outputs position information indicating an input bit position of the frame signal, a position designator (23) which designates an arbitrary bit position of the frame signal, and a trigger signal generating circuit (24) which outputs a trigger signal at a timing when the position information output by the position information output circuit is coincident with the arbitrary bit position designated by the position designator; and a sampling oscilloscope (25) which receives the trigger signal output from the trigger signal generating circuit of the trigger signal generating apparatus, sampling the frame signal with a trigger signal input timing as a reference timing and acquiring and displaying waveform information in a neighborhood of the arbitrary bit position designated by the position designator.

According to a eighth aspect of the invention, there is provided a frame signal waveform observation apparatus of the seventh aspect, wherein the sampling oscilloscope has a function of acquiring the waveform information in the neighborhood of designated arbitrary bit position for a plurality of times and averaging them thereby to display averaged waveform information in the neighborhood of the designated arbitrary bit position in such a manner that a phase variation dependent on a bit pattern of the frame signal can be measured while suppressing the phase variation of random noise type of the frame signal.

According to a ninth aspect of the invention, there is provided a frame signal waveform observation apparatus of the seventh aspect, wherein the frame signal having the predetermined bit rate is transmitted by a digital synchronous network.

According to a tenth aspect of the invention, there is provided a frame signal waveform observation apparatus of the ninth aspect, wherein the frame signal transmitted by the digital synchronous network is that of one of the digital synchronous transmission systems including a synchronous digital hierarchy (SDH), synchronous optical network (SONET) and optical transport network (OTN).

According to a eleventh aspect of the invention, there is provided a frame signal waveform observation apparatus of the tenth aspect, wherein when the frame signal transmitted by the digital synchronous network is associated with one of the digital synchronous transmission systems including SDH, SONET and OTN, the bit position designated by the position designator is a specified part of an overhead of the frame signal of the digital synchronous transmission system.

According to a twelfth aspect of the invention, there is provided a frame signal waveform observation apparatus of the eleventh aspect, wherein the specified part of the overhead of the frame signal of the digital synchronous transmission system is not scrambled.

According to a thirteenth aspect of the invention, there is provided a frame signal waveform observation apparatus of the seventh aspect, wherein the trigger signal generating apparatus further comprises a clock recovery circuit (30) which receives the frame signal having the predetermined bit rate and recovers and outputs a clock from the frame signal, and wherein the sampling oscilloscope (25) of the frame signal waveform observation apparatus acquires and displays waveform information of the clock recovered by the clock recovery circuit in addition to displaying the waveform information in a neighborhood of arbitrary bit position of the frame signal designated by the position designator.

According to a fourteenth aspect of the invention, there is provided a frame signal waveform observation apparatus of the eighth aspect, wherein the trigger signal generating apparatus further comprises a clock recovery circuit (30) which receives the frame signal having the predetermined bit rate and recovers and outputs a clock from the frame signal, and wherein the sampling oscilloscope (25) of the frame signal waveform observation apparatus has a function of acquiring waveform information in the neighborhood of designated arbitrary bit position for a plurality of times and averaging them and the function of acquiring the waveform information of the clock recovered by the clock recovery circuit (30) and averaging them, whereby a phase variation of random noise type is suppressed thereby to display the waveform information in the neighborhood of the designated arbitrary bit position of the frame signal and the averaged waveform information of the clock with the phase variation of random noise type suppressed.

According to a fifteenth aspect of the invention, there is provided a trigger signal generating method comprising:

receiving a frame signal having a predetermined bit rate and outputting a synchronous signal in synchronism with an input timing of leading data of the frame signal;

receiving the synchronous signal and outputting position information indicating an input bit position of the frame signal;

designating an arbitrary bit position of the frame signal; and outputting a trigger signal at a timing when the position information is coincident with the designated arbitrary bit position.

According to a sixteenth aspect of the invention, there is provided a trigger signal generating method according of the fifteenth aspect, wherein the frame signal having the predetermined bit rate is transmitted by a digital synchronous network.

According to a seventeenth aspect of the invention, there is provided a trigger signal generating method according of the sixteenth aspect, wherein the frame signal transmitted by the digital synchronous network is that of one of the digital synchronous transmission systems including a synchronous digital hierarchy (SDH), synchronous optical network (SONET) and optical transport network (OTN).

According to a eighteenth aspect of the invention, there is provided a trigger signal generating method according of the seventeenth aspect, wherein when the frame signal transmitted by the digital synchronous network is associated with one of the digital synchronous transmission systems including SDH, SONET and OTN, the arbitrary bit position of the frame signal designated as a trigger signal generating position is a specified part of an overhead of the frame signal of the digital synchronous transmission system.

According to a nineteenth aspect of the invention, there is provided a trigger signal generating method according of the eighteenth aspect, wherein the specified part of the overhead of the frame signal of the digital synchronous transmission system is not scrambled.

According to a twentieth aspect of the invention, there is provided a trigger signal generating method according of the fifteenth aspect, further comprising:

receiving the frame signal having the predetermined bit rate and recovering and outputting a clock from the frame signal.

According to a twenty-first aspect of the invention, there is provided a frame signal waveform observation method comprising:

receiving a frame signal having a predetermined bit rate and outputting a synchronous signal in synchronism with an input timing of leading data of the frame signal;

receiving the synchronous signal and outputting position information indicating an input bit position of the frame signal;

designating an arbitrary bit position of the frame signal;

outputting a trigger signal at a timing when the position information is coincident with the designated arbitrary bit position; and receiving the trigger signal, sampling the frame signal with a trigger signal input timing as a reference timing and acquiring waveform information of the designated arbitrary bit position of the frame signal.

According to a twenty-second aspect of the invention, there is provided a frame signal waveform observation method of the twenty-first aspect, further comprising:

acquiring the waveform information in a neighborhood of the designated arbitrary bit position of the frame signal having the predetermined bit rate repeatedly for a plurality of times;

averaging the waveform information in the neighborhood of the designated arbitrary bit position of the frame signal acquired for the plurality of times; and suppressing a phase variation of random noise type of the frame signal and displaying the phase variation dependent on a bit pattern of the frame signal in a measurable way, based on the waveform information in the neighborhood of the designated arbitrary bit position of the frame signal which have been averaged.

According to a twenty-third aspect of the invention, there is provided a frame signal waveform observation method of the twenty-first, wherein the frame signal having the predetermined bit rate is transmitted by a digital synchronous network.

According to a twenty-fourth aspect of the invention, there is provided a frame signal observation method of the twenty-third aspect, wherein the frame signal transmitted by the digital synchronous network is that of one of the digital synchronous transmission systems including a synchronous digital hierarchy (SDH), synchronous optical network (SONET) and optical transport network (OTN).

According to a twenty-fifth aspect of the invention, there is provided a frame signal waveform observation method of the twenty-fourth aspect, wherein when the frame signal transmitted by the digital synchronous network is associated with one of the digital synchronous transmission systems including SDH, SONET and OTN, the bit position designated by the position designator is a specified part of an overhead of the frame signal of the digital synchronous transmission system.

According to a twenty-sixth aspect of the invention, there is provided a frame signal waveform observation method of the twenty-fifth aspect, wherein the specified part of the overhead of the frame signal of the digital synchronous transmission system is not scrambled.

According to a twenty-seventh aspect of the invention, there is provided a frame signal waveform observation method of the twenty-first aspect, further comprising:

receiving the frame signal having the predetermined bit rate and recovering and outputting a clock from the frame signal;

acquiring by sampling a waveform information of the clock recovered from the frame signal; and displaying the waveform information of the clock acquired by sampling.

According to a twenty-eighth aspect of the invention, there is provided a frame signal waveform observation method of the twenty-second aspect, further comprising:

receiving the frame signal having the predetermined bit rate and recovering and outputting a clock from the frame signal;

acquiring, by sampling for a plurality of times, the waveform information of the clock recovered from the frame signal;

averaging the waveform information of the clock acquired by sampling for a plurality of times; and displaying, as related to each other, averaged waveform information of the clock and the averaged waveform information in the neighborhood of the designated arbitrary bit position of the frame signal in order to make it possible to measure a phase variation dependent on a bit pattern of the frame signal by comparison with the averaged waveform information of the clock while suppressing the phase variation of random noise type of the frame signal.

BRIEF DESCRIPTION OF DRAWINGS

FIGS. 2A, 2B, 2C, and 2D are timing charts for explaining the operation of the main portions in FIG. 1;

FIGS. 3A, 3B, and 3C are timing charts for explaining the operation of the main portions in FIG. 1;

BEST MODE FOR CARRYING OUT THE INVENTION

An embodiment of the invention is explained below with reference to the drawings.

Figure 1:
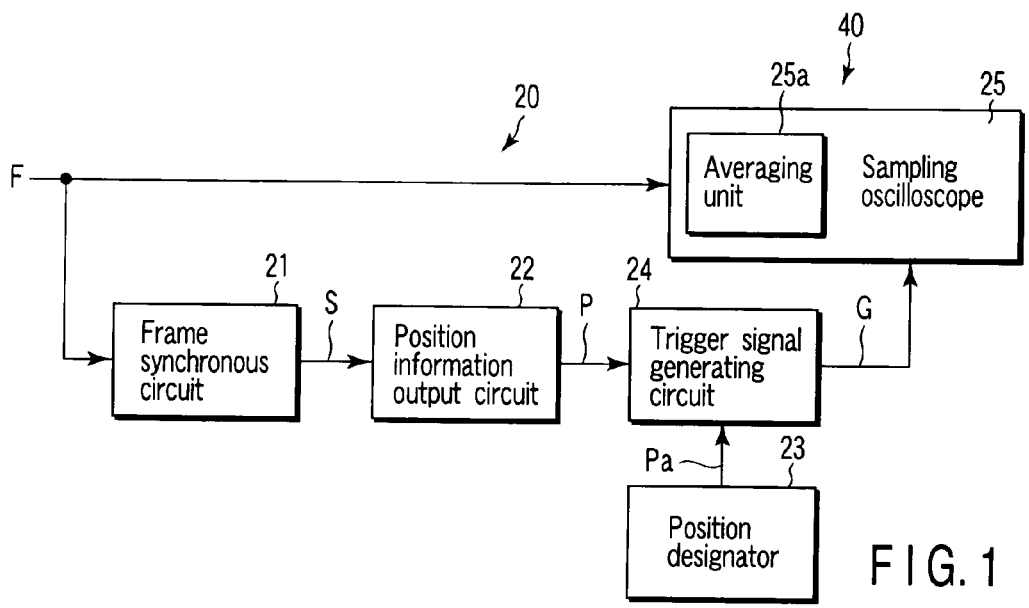
FIG. 1 is a block diagram for explaining the configuration according to an embodiment of the invention applicable to a trigger signal generating system comprising a trigger signal generating apparatus and method and a frame signal waveform observation system comprising a frame signal waveform observation apparatus 40 and method using the trigger signal generating system.

FIG. 1 is a block diagram for explaining the configuration according to an embodiment of the invention applicable to a trigger signal generating system including a trigger signal generating apparatus 20 and method and a frame signal waveform observation system including a frame signal waveform observation apparatus 40 and method using the trigger signal generating system.

Specifically, the trigger signal generating apparatus 20 includes a frame synchronous circuit 21 which receives a frame signal of a predetermined bit rate and outputs a synchronous signal in synchronism with an input timing of leading data of the frame signal, a position information output circuit 22 which receives the synchronous signal output from the frame synchronous circuit 21 and outputs the position information indicating an input bit position of the frame signal, a position designator 23 which designates an arbitrary bit position of the frame signal, and a trigger signal generating circuit 24 which outputs a trigger signal at the timing when the position information output from the position information output circuit 22 is coincident with the arbitrary bit position designated by the position designator 23.

The frame signal waveform observation apparatus 40, on the other hand, includes the trigger signal generating apparatus 20 configured as described above and a sampling oscilloscope 25 which receives the trigger signal output from the trigger signal generating circuit 24 of the trigger signal generating apparatus 20, samples the frame signal with a trigger signal input timing as a reference timing and displays by acquiring waveform information in the neighborhood of the arbitrary bit position designated by the position designator 23.

In FIG. 1, the frame synchronous circuit 21 receives, for observation, a serial frame signal F having a predetermined bit rate R (for example, 9.95 Gbps) used for a digital synchronous transmission system such as a synchronous digital hierarchy (SDH), synchronous optical network (SONET) or optical transport network (OTN), and outputs a synchronous signal S in synchronism with an input timing of leading data of the particular frame signal to the position information output circuit 22.

The frame synchronous circuit 21 detects a predetermined code inserted at the leading position of an overhead of the frame signal F and outputs the synchronous signal S in synchronism with a detection timing.

The predetermined code inserted at the leading position of the overhead of the frame signal F is a specified part of the overhead of the frame signal in a digital synchronous transmission system such as SDH, SONET or OTN.

The specified part of the overhead of the frame signal in a digital synchronous transmission system such as SDH, SONET or OTN is a part of the leading portion of the overhead not scrambled.

The position information output circuit 22, upon receipt of the synchronous signal S from the frame synchronous circuit 21, outputs the position information P indicating the input bit position of the frame signal F.

The position information output circuit 22 is configured of, for example, a counter for counting the signal of a frequency or a divided frequency signal thereof corresponding to the bit rate from the input timing of the synchronous signal S, which counter outputs the count output of the counter as the present input position information P of the frame signal F.

The position designator 23 designates an arbitrary bit position Pa of the frame signal F.

The arbitrary bit position Pa of the frame signal F may be a predetermined code inserted at the leading position of the overhead of the frame signal F such as a specified part of the overhead of the frame signal of the digital synchronous transmission system including SDH, SONET or OTN.

The specified part of the overhead of the frame signal of the digital synchronous transmission system including SDH, SONET or OTN may be a part such as the leading portion of the overhead not scrambled.

The trigger signal generating circuit 24 outputs a trigger signal G at the timing when the position information P output from the position information output circuit 22 coincides with the bit position Pa designated by the position designator 23.

The trigger signal G is input to the sampling oscilloscope 25 together with the frame signal F.

The sampling oscilloscope 25, by sampling the frame signal F with the input timing of the trigger signal G as a reference timing, acquires and displays the waveform information in the neighborhood of the bit position Pa designated by the position designator 23.

Specifically, the sampling oscilloscope 25 samples the frame signal F a predetermined number (N) of times in each period Ts longer (or shorter) than an integer (K) multiple of the input period (the frame period of the frame signal F) of the trigger signal G by a small time ΔT, so that the waveform information in the neighborhood of the designated bit position is acquired with the time resolution of ΔT and displayed on the screen.

In this case, the sampling oscilloscope 25 includes therein an averaging unit 25a for acquiring the waveform information in the neighborhood of the designated bit position for a plurality of times and averaging them. In this way, the sampling oscilloscope 25 has the function of suppressing the phase variation of random noise type of the frame signal F and displaying the phase variation dependent on a bit pattern of the frame signal F in a measurable way.

Next, the operation of the trigger signal generating apparatus 20 and the frame signal waveform observation apparatus 40 using the apparatus 20 is explained.

Assume, for example, that the frame signals F1, F2 and so forth of period T are input as shown in FIG. 2A. The frame synchronous circuit 21 outputs the synchronous signals S in synchronism with the leading position of each of the frame signals F1, F2 and so forth as shown in FIG. 2B.

The position information output circuit 22 that has received the synchronous signals S sequentially outputs the position information P indicating each input bit position of the frame signal F as shown in FIG. 2C.

At the timing when this position information P is coincident with the bit position Pa designated by the position designator 23, the trigger signal generating circuit 24 outputs the corresponding trigger signal G as shown in FIG. 2D.

The sampling oscilloscope 25, as shown in FIG. 3A, internally generates sampling pulses Ps of period Ts equal to K·T+ΔT (K=1 in the case under consideration) to the trigger signal G input in period T, as shown in FIG. 3B and acquires the waveform information Hd by sampling the data signal of the Pa-th bit (which may include a subsequent bit) of each frame the number N of times using the sampling pulses Ps as shown in FIG. 3C.

The time width of the waveform information Hd thus acquired is given as N·ΔT which is equal to N·ΔT·R in terms of bit width.

Figure 4:
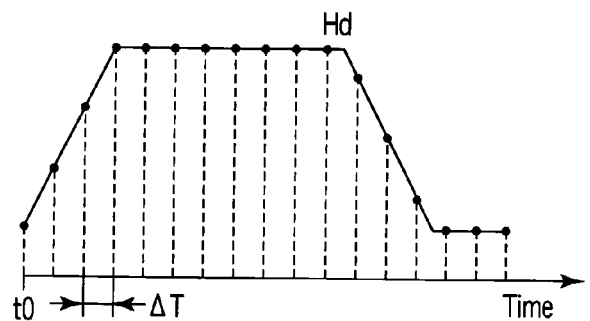
FIG. 4 is a waveform diagram for explaining the operation of the main portions in FIG. 1.

The waveform information Hd, as shown in FIG. 4, is displayed on the screen with the time resolution ΔT with the first sampling timing as a reference timing t0.

In the case of the waveform such as Hd undergoing the transition from 0 to 1 to 0 as shown in FIG. 4, the user can grasp the amount of phase variation with respect to the reference timing by checking the difference between the reference timing t0 and the rise time of the waveform or the difference between the timing when 1/R has passed from the reference timing t0 and the fall time of the waveform.

When a different bit position Pa is designated by the position designator 23, on the other hand, the user can observe the waveform at the designated position.

Thus, by designating all the bit positions using the position designator 23, for example, the user can grasp the amount of phase variation at each bit position by observing the waveform at each of the designated positions on the screen of the sampling oscilloscope 25.

In this case, the sampling oscilloscope 25 includes an internal averaging unit 25a having the function of acquiring the waveform information in the neighborhood of the designated arbitrary bit position for a plurality of times and averaging them. Thus, the phase variation dependent on the bit pattern of the frame signal is displayed on the screen in a measurable way while suppressing the phase variation of random noise type of the frame signal.

As a result, the user can accurately grasp, without being affected by the phase variation of random noise type, a particular bit position of the frame signal associated with a large phase variation, i.e., the pattern-dependent phase variation of the frame signal.

Figure 5:
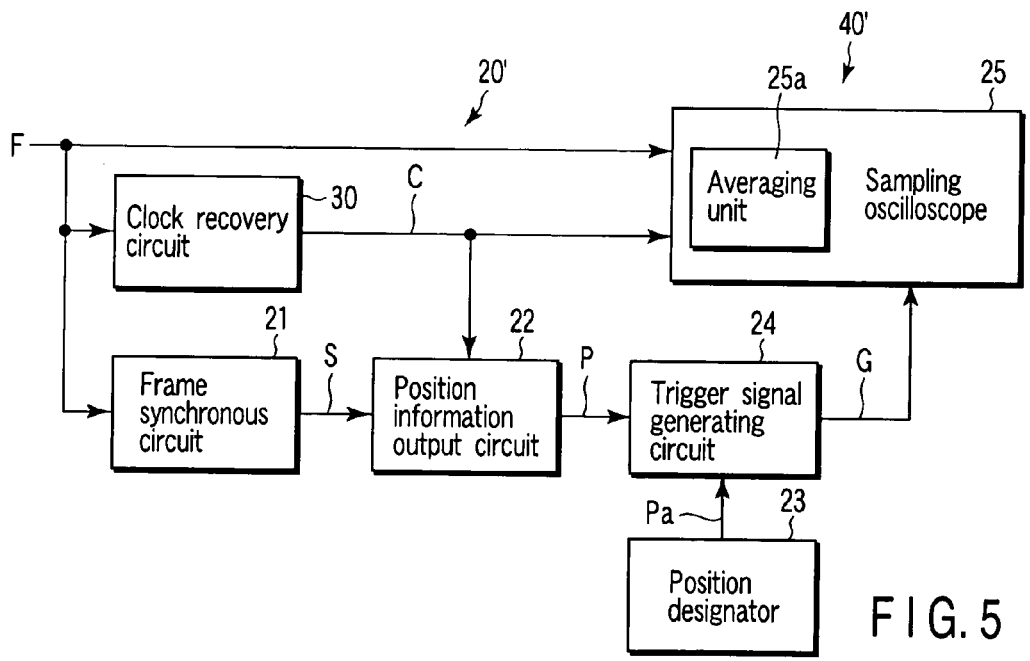
FIG. 5 is a block diagram for explaining the configuration according to another embodiment of the invention applicable to a trigger signal generating system comprising a trigger signal generating apparatus and method and a frame signal waveform observation system comprising a frame signal waveform observation apparatus 40 and method using the trigger signal generating system.

FIG. 5 is a block diagram for explaining the configuration of another embodiment of the invention applicable to a trigger signal generating system comprising a trigger signal generating apparatus 20' and method and a frame signal waveform observation system comprising a frame signal waveform observation apparatus 40' and method using the trigger signal generating system.

In FIG. 5, the component parts similar to those of the trigger signal generating apparatus 20 and the frame signal waveform observation apparatus 40 according to the embodiment shown in FIG. 1 and described above are designated by the same reference numerals, respectively, and not explained again.

In the frame signal waveform observation apparatus 40 according to the embodiment shown in FIG. 1, only the waveform of the frame signal is observed. According to the embodiment, in contrast, the addition of a clock recovery circuit 30 to the configuration of FIG. 1 makes it possible to observe the clock waveform information at the same time, as in the trigger signal generating apparatus 20' and the frame signal waveform observation apparatus 40' shown in FIG. 5.

Specifically, the clock C is recovered from the frame signal F by the clock recovery circuit 30, and the clock C thus recovered is input to the sampling oscilloscope 25 together with the frame signal F.

In this case, the sampling oscilloscope 25 includes therein an averaging unit 25a which acquires, a plurality of time, the waveform information in the neighborhood of the designated bit position and the clock C recovered from the frame signal F by the clock recovery circuit 30, and averages them. In this way, the sampling oscilloscope 25 has the function of suppressing the phase variation of random noise type of the frame signal F and displaying, in a measurable way, the phase variation dependent on the bit pattern of the frame signal F as related to the clock C.

Figure 6:
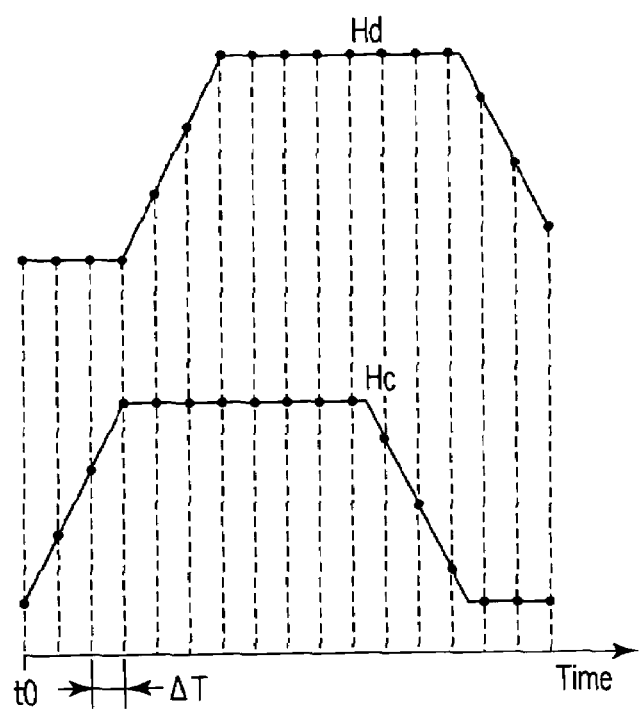
FIG. 6 is a waveform diagram for explaining the operation of the main portions in FIG. 5.
Figure 7:
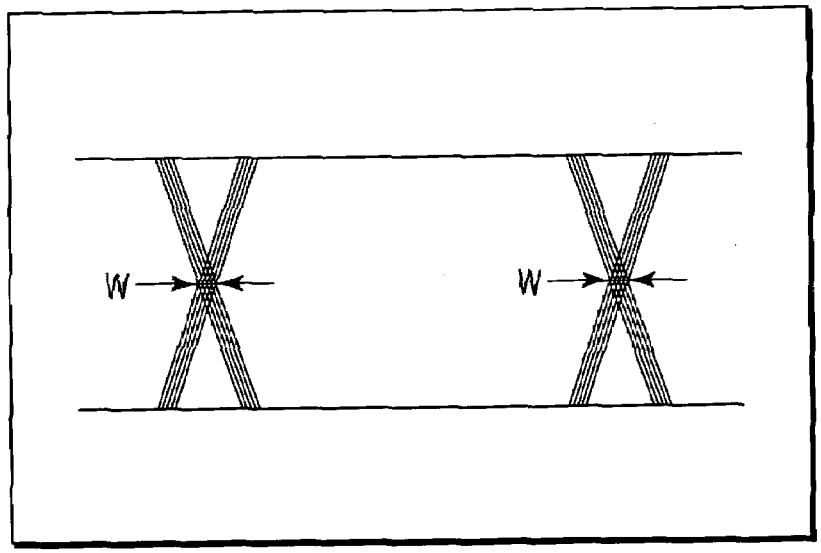
FIG. 7 shows an eye pattern for explaining the conventional method of measuring the phase variation of the data signal.

As a result, the sampling oscilloscope 25 samples the frame signal F and the clock C with the input timing of the trigger signal G as a reference timing as in the aforementioned case while at the same time acquiring the waveform information of the two signals a plurality of times and averaging them through the averaging unit 25a. Thus, the waveform information Hd, Hc of the two signals can be acquired, and as shown in FIG. 6, displayed in vertical juxtaposition on the same time axis on the screen.

The clock recovery circuit 30 can be configured of, for example, a waveform shaping circuit and a bandpass filter (BPF) of a narrow bandwidth having the frequency corresponding to the bit rate of the frame signal as a central frequency of passband. Thus, the clock C free of the effect of the phase variation (i.e., free of the phase fluctuation) of the frame signal F can be recovered.

The user checks the phase difference between the waveform of the clock C and the waveform of the frame signal F free of the phase fluctuation on the screen of the sampling oscilloscope 25, and thus can accurately and intuitively grasp the amount of the phase variation of each bit position of the frame signal F.

Specifically, the user measures the time deviation between the rise and fall of the waveform of the averaged frame signal F and the rise or fall of the waveform of the averaged clock C based on the waveform information Hc of the clock C and the waveform information Hd of the frame signal F displayed in vertical juxtaposition on the same time axis on the screen of the sampling oscilloscope 25, and thus can accurately and intuitively measure the amount of phase variation occurring in dependence on the pattern of the data signal.

In this case, the position information output circuit 22 is configured to count the recovered clock C and output the count as the position information P.

As explained above, the trigger signal generating apparatus according to the invention comprises a frame synchronous circuit which receives a frame signal and outputs a synchronous signal in synchronism with the input timing of the leading data of the particular frame signal, a position information output circuit which receives the synchronous signal and outputs the position information indicating the input bit position of the frame signal, a position designator which designates an arbitrary bit position of the frame signal, and a trigger signal generating circuit which outputs a trigger signal at the timing when the position information output from the position information output circuit is coincident with the position designated by the position designator.

Also, in the trigger signal generating method according to the invention, a frame signal of a predetermined bit rate is received so that a synchronous signal is output in synchronism with the input timing of the leading data of the frame signal, the particular synchronous signal is received so that the position information indicating the input bit position of the frame signal is output, and an arbitrary bit position of the frame signal is designated so that a trigger signal is output at the timing when the position information is coincident with the designated bit position.

As a result, the trigger signal generating system according to the invention, in which the trigger signal can be output accurately at an arbitrary bit position of the frame signal, can find various applications requiring a trigger signal.

A frame signal waveform observation apparatus according to the invention, on the other hand, comprises a trigger signal generating apparatus having the aforementioned configuration, and a sampling oscilloscope which samples the frame signal with the input timing of the trigger signal from the trigger signal generating apparatus as a reference timing and thereby acquiring and displaying the waveform information in the neighborhood of the bit position designated by the position designator.

Also, in a frame signal waveform observation method according to the invention, a frame signal of a predetermined bit rate is received so that a synchronous signal is output in synchronism with the input timing of the leading data of the frame signal, the particular synchronous signal is received so that the position information indicating the input bit position of the frame signal is output, an arbitrary bit position of the frame signal is designated so that a trigger signal is output at the timing when the position information is coincident with the designated bit position, and the trigger signal is received so that the frame signal is sampled with the trigger signal input timing as a reference timing so that the waveform information in the neighborhood of the designated bit position is acquired and displayed.

For this reason, in the frame signal waveform observation system according to the invention, the data waveform at an arbitrary bit position of the frame signal can be accurately acquired and displayed, and therefore the user can accurately grasp the phase variation of the data from the particular waveform.

Also, in the frame signal waveform observation system according to the invention comprising a clock recovery circuit which recovers the clock from the frame signal, the waveform information of both the frame signal and the clock are displayed on the sampling oscilloscope. The waveforms at the designated positions of the frame signal and the clock are compared with each other with the result that the user can intuitively grasp the phase variation at each bit position.

The invention claimed is:

1. A frame signal waveform observation apparatus comprising:
   a trigger signal generating apparatus comprising:
      a frame synchronous circuit which receives a frame signal having a predetermined bit rate and outputs a synchronous signal in synchronism with an input timing of leading data of the frame signal,
      a position information output circuit which receives the synchronous signal output by the frame synchronous circuit and outputs position information indicating an input bit position of the frame signal,
      a position designator which designates an arbitrary bit position of the frame signal, and
      a trigger signal generating circuit which outputs a trigger signal at a timing when the position information output by the position information output circuit is coincident with the arbitrary bit position designated by the position designator; and
   a sampling oscilloscope which receives the trigger signal output from the trigger signal generating circuit of the trigger signal generating apparatus, samples the frame signal with a trigger signal input timing as a reference timing, and acquires and displays waveform information in a neighborhood of the arbitrary bit position designated by the position designator,
   wherein the sampling oscilloscope has a function of acquiring the waveform information in the neighborhood of designated arbitrary bit position for a plurality of times and averaging them to thereby display averaged waveform information in the neighborhood of the designated arbitrary bit position in such a manner that a phase variation dependent on a bit pattern of the frame signal can be measured while suppressing the phase variation of random noise type of the frame signal.

2. A frame signal waveform observation apparatus according to claim 1, wherein the frame signal having the predetermined bit rate is transmitted by a digital synchronous network.

3. A frame signal waveform observation apparatus according to claim 2, wherein the frame signal transmitted by the digital synchronous network is that of one of a digital synchronous transmission system including a synchronous digital hierarchy (SDH), synchronous optical network (SONET) and optical transport network (OTN).

4. A frame signal waveform observation apparatus according to claim 3, wherein when the frame signal transmitted by the digital synchronous network is associated with the one of the digital synchronous transmission system including SDH, SONET and OTN, and the bit position designated by the position designator is a specified part of an overhead of the frame signal of the digital synchronous transmission system.

5. A frame signal waveform observation apparatus according to claim 4, wherein the specified part of the overhead of the frame signal of the digital synchronous transmission system is not scrambled.

6. A frame signal waveform observation apparatus according to claim 1, wherein the trigger signal generating apparatus further comprises a clock recovery circuit which receives the frame signal having the predetermined bit rate and recovers and outputs a clock from the frame signal, and
   wherein the sampling oscilloscope has a function of acquiring the waveform information of the clock recovered by the clock recovery circuit and averaging them, whereby a phase variation of random noise type is suppressed to thereby display the waveform information in the neighborhood of the designated arbitrary bit position of the frame signal and the averaged waveform information of the clock with the phase variation of random noise type suppressed.

7. A frame signal waveform observation method, comprising:
   receiving a frame signal having a predetermined bit rate and outputting a synchronous signal in synchronism with an input timing of leading data of the frame signal;
   receiving the synchronous signal and outputting position information indicating an input bit position of the frame signal;
   designating an arbitrary bit position of the frame signal;
   outputting a trigger signal at a timing when the position information is coincident with the designated arbitrary bit position;
   receiving the trigger signal, sampling the frame signal with a trigger signal input timing as a reference timing, and acquiring waveform information of the designated arbitrary bit position of the frame signal;
   acquiring the waveform information in a neighborhood of the designated arbitrary bit position of the frame signal having the predetermined bit rate repeatedly for a plurality of times;
   averaging the waveform information in the neighborhood of the designated arbitrary bit position of the frame signal acquired for the plurality of times; and
   suppressing a phase variation of random noise type of the frame signal and displaying the phase variation dependent on a bit pattern of the frame signal in a measurable way, based on the waveform information in the neighborhood of the designated arbitrary bit position of the frame signal which have been averaged.

8. A frame signal waveform observation method according to claim 7, wherein the frame signal having the predetermined bit rate is transmitted by a digital synchronous network.

9. A frame signal waveform observation method according to claim 8, wherein the frame signal transmitted by the digital synchronous network is that of one of a digital synchronous transmission system including a synchronous digital hierarchy (SDH), synchronous optical network (SONET) and optical transport network (OTN)

10. A frame signal waveform observation method according to claim 9, wherein when the frame signal transmitted by the digital synchronous network is associated with the one of the digital synchronous transmission system including SDH, SONET and OTN, and the bit position designated by the position designator is a specified part of an overhead of the frame signal of the digital synchronous transmission system.

11. A frame signal waveform observation method according to claim 10, wherein the specified part of the overhead of the frame signal of the digital synchronous transmission system is not scrambled.

12. A frame signal waveform observation method according to claim 7, further comprising:
   receiving the frame signal having the predetermined bit rate and recovering and outputting a clock from the frame signal;
   acquiring, by sampling for a plurality of times, the waveform information of the clock recovered from the frame signal;
   averaging the waveform information of the clock acquired by sampling for a plurality of times; and displaying, as related to each other, averaged waveform information of the clock and the averaged waveform information in the neighborhood of the designated arbitrary bit position of the frame signal in order to make it possible to measure a phase variation dependent on a bit pattern of the frame signal by comparison with the averaged waveform information of the clock while suppressing the phase variation of random noise type of the frame signal.

* * * * *